United States Patent
Fritz et al.

(10) Patent No.: US 10,840,935 B2
(45) Date of Patent: Nov. 17, 2020

(54) PASSIVE CONJUNCTION CIRCUIT AND VOLTAGE MEASUREMENT CIRCUIT

(71) Applicant: SAMSUNG SDI CO., LTD., Yongin-si (KR)

(72) Inventors: Juergen Fritz, Graz (AT); Thomas Korherr, Hartberg (AT)

(73) Assignee: Samsung SDI Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/498,268

(22) PCT Filed: Jan. 26, 2018

(86) PCT No.: PCT/KR2018/001186
§ 371 (c)(1),
(2) Date: Sep. 26, 2019

(87) PCT Pub. No.: WO2018/225929
PCT Pub. Date: Dec. 13, 2018

(65) Prior Publication Data
US 2020/0106453 A1 Apr. 2, 2020

(30) Foreign Application Priority Data

Jun. 6, 2017 (EP) .................................... 17174514

(51) Int. Cl.
*H03M 1/12* (2006.01)
*H03F 3/45* (2006.01)
*H03M 1/06* (2006.01)

(52) U.S. Cl.
CPC ........ *H03M 1/124* (2013.01); *H03F 3/45475* (2013.01); *H03F 2200/06* (2013.01); *H03M 1/0682* (2013.01)

(58) Field of Classification Search
CPC ........................... H03M 1/124; H03F 3/45475
(Continued)

(56) References Cited

U.S. PATENT DOCUMENTS

| 4,947,169 A | * | 8/1990 | Smith | H03M 1/1057 341/118 |
| 5,256,979 A | * | 10/1993 | Moorman | G01R 15/04 324/140 R |

(Continued)

FOREIGN PATENT DOCUMENTS

JP 2015-023581 A 2/2015

OTHER PUBLICATIONS

Austin, John, "Getting the Full Potential from Your ADC," *Texas Instruments Application Report*, SBAA06B—Mar. 2001—Revised May 2015, pp. 1-7. XP055423006: URL:http://www.ti.com/lit/an/sbaa069b/sbaa069b.pdf.

(Continued)

*Primary Examiner* — Lam T Mai
(74) *Attorney, Agent, or Firm* — Knobbe, Martens, Olson & Bear, LLP (57) ABSTRACT

A passive conjunction circuit for an analog-to-digital converter (ADC) is disclosed. In one aspect, the passive conjunction circuit includes a first input node receiving an analog input signal to be converted by the ADC and a second input node receiving a reference voltage other than a ground voltage of the ADC. The passive conjunction circuit also includes a first output node to be connected to a first differential input of the ADC (20) and a second output node to be connected to a second differential input of the ADC. The passive conjunction circuit further includes a first voltage divider interconnected between the first input and output nodes and a second voltage divider interconnected between the second input and output nodes.

15 Claims, 3 Drawing Sheets

(58) Field of Classification Search
USPC .................................................. 341/125–155
See application file for complete search history.

(56) References Cited

U.S. PATENT DOCUMENTS

| | | | | |
|---|---|---|---|---|
| 5,500,612 | A * | 3/1996 | Sauer | G11C 27/02 |
| | | | | 327/91 |
| 5,544,089 | A * | 8/1996 | Hemminger | H02J 13/00012 |
| | | | | 702/64 |
| 8,878,587 | B1 | 11/2014 | Steensgaard-Madsen | |
| 10,347,952 | B2 * | 7/2019 | Choi | H01M 10/482 |
| 10,491,012 | B2 * | 11/2019 | Kang | H02J 7/0024 |
| 10,491,013 | B2 * | 11/2019 | Kang | H01M 10/482 |
| 2006/0071838 | A1 * | 4/2006 | Runals | H03G 1/0088 |
| | | | | 341/155 |
| 2014/0043031 | A1 | 2/2014 | Kain et al. | |
| 2014/0055095 | A1 | 2/2014 | Kim et al. | |
| 2014/0142879 | A1 | 5/2014 | Lucchese | |
| 2015/0061745 | A1 * | 3/2015 | Shih | H04L 25/00 |
| | | | | 327/333 |
| 2015/0194909 | A1 * | 7/2015 | Pahlevaninezhad | |
| | | | | H02M 7/5387 |
| | | | | 363/132 |
| 2015/0303885 | A1 * | 10/2015 | Kinyua | H03F 3/2175 |
| | | | | 330/251 |
| 2015/0372539 | A1 | 12/2015 | Livadaras et al. | |
| 2016/0344403 | A1 | 11/2016 | Sonnaillon | |
| 2019/0074803 | A1 * | 3/2019 | Marino | H03F 3/187 |

OTHER PUBLICATIONS

Chioye, Luis, "Improve Noise Immunity on RTD Ratiometric Measurements," *electronic design*, (Apr. 1, 2013) pp. 1-11. XP055423386: URL:http://www.electronicdesign.com/analog/improve-noise-immunity-rtd-ratiometric-measurements.

Extended European Search Report dated Nov. 16, 2017 for European Patent Application No. EP 17 174 514.4 from which the subject U.S. Appl. No. 16/498,268 claims priority.

International Search Report and Written Opinion dated May 4, 2018 for International Application No. PCT/KR2018/001186 of which subject U.S. Appl. No. 16/498,268 is a National Stage Entry.

Carter, Bruce, "Buffer Op Amp to ADC Circuit Collection Appendix A: How to Choose a Reference", Mar. 30, 2002 (Mar. 30, 2002), XP055397959, Retrieved from the Internet: URL: http://www.ti.com/lit/an/sloa098/sloa098.pdf [retrieved on Aug. 10, 2017].

Examination report dated Mar. 19, 2020 in European patent application No. 17174514.4, 7 pp.

* cited by examiner

PASSIVE CONJUNCTION CIRCUIT AND VOLTAGE MEASUREMENT CIRCUIT

INCORPORATION BY REFERENCE TO ANY PRIORITY APPLICATIONS

This application is a U.S. national phase application of PCT/KR2018/001186 filed on Jan. 26, 2018 that claims the benefit of European Patent Application No. 17174514.4 filed on Jun. 6, 2017, each of which is incorporated by reference herein in its entirety.

BACKGROUND

Technical Field

The present invention relates to a passive conjunction circuit for an analog-to-digital converter (ADC), to a voltage measurement circuit comprising the passive conjunction circuit and to a battery system comprising the voltage measurement circuit.

Description of the Related Technology

Voltage measurements occur frequently in most kinds of electronic devices for providing reliable and safe operation of the devices. Exemplarily, control circuits integrated in the devices may measure voltages at critical structures and/or at interfaces of the device, e.g. for overvoltage protection. In order to compare, save or otherwise process the obtained voltage values they may be converted into a digital bitstream via analog to digital converters, ADCs.

Various circuitries exists for providing analog to digital conversion, wherein different kinds of circuits may be utilized for providing different levels of resolution, speed, noise or power consumption. Exemplarily, successive approximation register analog-to-digital converter, SAR ADCs, produce a digital discrete time representation of a continuous analog waveform.

When deciding which kind of ADC is to be used for a certain application, the analog input signal types supported by different kinds of ADCs have to be considered. Common signal input types that can be realized with most of ADC circuit designs comprise single ended analog input types, pseudo-differential input types and fully differential input types.

While single ended input type ADCs usually comprise only a single voltage input pin, differential input type ADCs are characterized by two voltage input pins. While the single ended input type ADC measures an applied analog signal relative to the ADCs common ground, a differential input type ADC digitizes a differential analog input signal that is applied via both of the voltage input pins. Hence, common-mode voltage components are rejected in a differential input type ADC but not or less in a single ended input type ADC.

Single ended input type ADCs and a variety of differential input type ADCs are capable of converting analog signals only within a certain interval of electrical potential above a reference ground of the ADC. However, in numerous systems a current direction may vary, e.g. during charging or discharging of a battery system. Hence in such systems negative or bipolar voltage measurements are required frequently. Herein, negative voltage measurement refer to voltage measurements within an interval below the reference ground of an ADC up to this reference ground and bipolar voltage measurements refer to voltage measurements within an interval below the reference ground of the ADC up to a potential above this reference ground.

According to the prior art, negative or bipolar voltage measurements may be realized utilizing differential input type ADCs with specially adapted external circuits. However, according to the prior art these external circuits comprise active components, e.g. operational amplifiers, and hence production costs and power consumption of the ADCs might be increased, while measurement performance might be reduced due to faults of the active components.

SUMMARY OF CERTAIN INVENTIVE ASPECTS

It is thus an object of the present invention to overcome or reduce at least some of the drawbacks of the prior art and to provide a costs sensitive conjunction circuit for an analog-to digital converter that allows for negative and bipolar voltage measurements.

One or more of the drawbacks of the prior art could be avoided or at least reduced by means of the present invention, according to which a passive conjunction circuit for an analog-to digital convert, ADC, is provided that comprises a first input node that is configured for receiving an analog input signal to be converted by the ADC and a second input node that is configured for receiving a reference voltage other than a reference ground voltage of the ADC. In other words, the passive conjunction circuit of the invention itself might be considered to constitute a single ended input for an analog signal. The signal may be a voltage signal that might be provided by a sensor, e.g. a temperature sensor or a voltage sensor. Further, the second input node is not connected to a reference ground voltage pin of the ADC to or by which a reference ground voltage of the ADC is supplied.

The passive conjunction circuit further comprises a first output node that is configured to be connected to a first differential input of the ADC and a second output node that is configured to be connected to a second differential input of the ADC. Further, a first voltage divider is interconnected between the first input node and the first output node. That is, a voltage applied to the first input node is the input voltage of the first voltage divider, while the first differential input node receives the output voltage of the first voltage divider. The first voltage divider suitably scales the input voltage before applying it to the first differential input.

Further, a second voltage divider is interconnected between the second input node and the second output node. That is, a voltage applied to the second input node is the input voltage of the second voltage divider, while the second differential input node receives the output voltage of the second voltage divider. The second voltage divider is used to create a reference potential on the second differential input using the reference voltage.

The passive conjunction circuit of the present invention does not comprise any active components, e.g. operational amplifiers, and is thus cost effective and has improved power efficiency. Still, the passive conjunction circuit is suitable for applying a single voltage signal to the fully differential input of an ADC. The passive conjunction circuit might be understood to provide a pseudo differential input type from a single analog input signal in order to feed it to a differential input of an ADC. Further, a reference voltage applied to the passive conjunction circuit is independent of the reference ground voltage of the ADC. Hence, the voltage input range of the ADC is less likely exceeded and the ADC's resolution is improved.

According to a preferred embodiment of the passive conjunction circuit, the first voltage divider comprises a first resistance that is connected in series with a second resistance, the second voltage divider comprises a third resistance that is connected in series with a fourth resistance and the fourth resistance is part of the second resistance. In other words, the fourth resistance is part of the first voltage divider and of the second voltage divider. Hence, the parts count and manufacturing costs of the conjunction circuit are further reduced.

In a particularly preferred embodiment of the passive conjunction circuit, the first resistance comprises a first resistor, while the second resistance comprises a second resistor and a fourth resistor. Further, the third resistance comprises a third resistor and the fourth resistance comprises the fourth resistor. Particularly preferred, the first resistance consists of the first resistor, the second resistance consists of the second resistor and the fourth resistor, the third resistance consists of the third resistor and the fourth resistance consists of the fourth resistor.

In the passive conjunction circuit of the present invention, each resistor may be a well matched precision resistor. Also, resistor-type impedance elements may be used for the resistances using any suitable material available, e.g. polysilicon material, crystal silicon material, metal material, carbon material, composite materials as silicon-chrome, and the like.

Dependent on the realization of the passive conjunction circuit, the resistor-type materials may be provided as thin and/or thick films, in bulk form, in uniform and/or non-uniform structures, as individually packaged components, or the like.

Further preferred, the first voltage divider and/or the second voltage divider are further connected to the grounding of the ADC, respectively. In other words, each of the voltage dividers uses a common grounding with the ADC. Alternatively, the voltage dividers may use a grounding that is different, particularly preferred isolated, of the grounding of the ADC in order to further reduce the probability of common mode signals to be present at the ADC's differential inputs.

According to an embodiment, the second input node is configured to receive a supply voltage of the ADC. In other words, the second input node of the passive conjunction circuit is connected with a supply pin of the ADC or a microcontroller comprising the ADC. In the context of the present invention, a microcontroller may also be an ASIC. In other words, a required supply voltage can be supplied by the ADC, while the reference voltage second node of the conjunction circuit remains unconnected with the reference ground voltage pin of the ADC or a microcontroller comprising the ADC. By providing the supply voltage of the ADC as a reference voltage via the second voltage divider, bipolar measurements within the rails of the ADC are enabled. In other words, the second output node of the conjunction circuit is configured to provide a reference potential to the second differential input, wherein the reference potential allows for negative and bipolar voltage measurements as defined above.

According to a further preferred embodiment, the passive conjunction circuit further comprises a first capacitor that is interconnected between the first differential input and a grounding, preferably a grounding of the ADC. Further preferred, a second capacitor is interconnected between the second differential input and grounding, preferably a grounding of the ADC. Therein the grounding of the ADC does not refer to a reference ground voltage pin of the ADC but solely to a ground potential against which the supply voltage of the ADC is determined. Exemplarily, the ADC and the first voltage divider may use earth or a package housing as common grounding. The first capacitor and the second capacitor attenuate high frequency noise that is applied to the first and second differential input.

Particularly preferred, the passive conjunction circuit of the invention further comprises a third capacitor that is interconnected between the first differential input and the second differential input of the ADC. In other words, the third capacitor is interconnected between the output of the first voltage divider, i.e. the first output node, and the output of the second voltage divider, i.e. the second output node. The third capacitor may further attenuate remaining noise, particularly common mode noise, that is due to capacitance mismatch of the first and second capacitor. Further, by utilizing the first, second and third capacitor the Nyquist theorem may be fulfilled depending on the bandwidth of the input voltage and the sampling frequency. However, further capacitors or resistors might be required for fulfilling the Nyquist theorem.

Further preferred the capacity of the third capacitor is at least ten times of the capacity of at least one, preferably both, of the first capacitor and the second capacitor. Also preferred, the first capacitor and the second capacitor comprise at least essentially identic nominal capacities. Thereby, a signal to noise ratio, SNR, of the ADC might be improved by strongly attenuating common mode noise. Capacitor-type impedance elements may likewise be implemented using any suitable materials, including common structures poly-insulator-poly (PIP) capacitors, poly-insulator-metal (PIM) capacitors, metal-insulator-metal (MIM and MOM) capacitors, as individually packaged components, or the like.

Another aspect of the present invention relates to a voltage measurement circuit, comprising an analog-to-digital-converter, ADC, and a passive conjunction circuit as described above. The analog-to-digital-converter comprises a first differential input and a second differential input that are configured for jointly receiving a differential analog signal that is to be digitalized within the ADC. The ADC further comprises a supply input for receiving a supply voltage. According to the present invention, the passive conjunction circuit is interconnected between an analog input signal and the first and second differential inputs of the ADC and further the passive conjunction circuit receives the supply voltage of the ADC as the reference voltage.

Preferably, the analog input signal is received by a first input node of the passive conjunction circuit and the supply voltage of the ADC is received as reference voltage by a second input node of the passive conjunction circuit. Therein, the supply voltage of the ADC differs from a reference ground voltage of the ADC. The passive conjunction circuit thus provides an interface between the analog input signal and the fully differential input of the ADC. Therein, the analog input signal preferably is a voltage signal and might be provided by a sensor. The differential inputs of the ADC are connected to a first output node and a second output node of the passive conjunction circuit, respectively. The first differential input receives a scaled analog input voltage derived from the analog input signal and the second differential input receives a reference voltage derived from the supply voltage of the ADC or from an external reference voltage. External reference voltage here denotes a voltage that is supplied neither by the ADC, a microcontroller comprising the ADC or a system to be measured, i.e. a system connected to the first input node of the passive conjunction circuit. In order to provide these signals to the differential inputs of the ADC a first voltage divider is interconnected between the first input node and the first output node of the passive conjunction circuit and a second voltage divider is interconnected between the second input node and the second output node of the passive conjunction circuit.

The passive conjunction circuit uses the supply voltage of the ADC or an externally provided reference voltage solely for deriving a reference voltage and feeds back the derived reference voltage to the ADC. Hence, the power consumption of the passive conjunction circuit is basically limited to the resistive losses of its components, particularly of the second voltage divider. The passive conjunction circuit enables negative and bipolar voltage measurements within the rails of the ADC. As the conjunction circuit preferably derives its reference voltage from the ADC's supply voltage, the voltage input range of the ADC may be less likely exceeded and the ADC's resolution is improved.

In a preferred embodiment of the present invention, the voltage measurement circuit of the invention comprises a reference ground voltage input for receiving an ADC reference ground voltage. Further preferred, the reference ground voltage input is isolated from the passive conjunction circuit. Thus common mode signal components may be advantageously reduced, even in a case where the ADC's reference ground voltage is derived from the ADC's supply voltage.

Particularly preferred, the ADC of the voltage measurement circuit is part of a microcontroller, wherein the microcontroller further comprises a first differential input pin and a second differential input pin. Further, a multiplexer and/or a programmable gain amplifier, PGA, may be interconnected between the differential inputs of the ADC and the differential input pins of the microcontroller. In this embodiment, the first and second output nodes of the passive conjunction circuit are connected to the first and second differential input pins of the microcontroller, respectively. Hence, the first and second output nodes are connected to the first and second differential inputs, respectively, via the differential input nodes, the multiplexer and the PGA. Preferably the ADC is a sigma-delta-analog-to-digital converter.

Another aspect of the present invention relates to a battery system comprising a voltage measurement circuit and hence a passive conjunction circuit as described above. In a preferred embodiment, the battery system comprises a plurality of battery modules, wherein each battery module comprises a plurality of aligned battery cells connected in series and/or in parallel between a first module terminal and a second module terminal. Further, each battery module comprises a cell supervision circuit, CSC, which is configured to measure the voltage of at least one of the battery module's battery cells. The battery system further comprises a system control unit, e.g. as a part of a BMS, BCU or CSC, comprising the voltage measurement circuit as described above. Typical examples for voltage measurements in the battery system utilizing the voltage measurement circuit of such system control unit are a voltage measurement between a high voltage pole and a low voltage ground, a high voltage measurement for relays diagnostics or within a precharge control circuit. Therein, the first input node of the passive conjunction circuit might be connected to one of the battery cells of the battery module and the supply voltage of the ADC might be provided by the battery module itself.

Advantageous Effects

An exemplary embodiment of the preset invention may provide a costs sensitive conjunction circuit for an analog-to digital converter that allows for negative and bipolar voltage measurements.

DESCRIPTION OF DRAWINGS

Features will become apparent to those of ordinary skill in the art by describing in detail exemplary embodiments with reference to the attached drawings in which.

DETAILED DESCRIPTION OF CERTAIN INVENTIVE EMBODIMENTS

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant 30 descriptions are omitted. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art.

Accordingly, processes, elements, and techniques that are not considered necessary to those having ordinary skill in the art for a complete understanding of the aspects and features of the present invention may not be described. In the drawings, the relative sizes of elements, layers, and regions may be exaggerated for clarity.

As used herein, the term "and/or" includes any and all combinations of one or more of the associated listed items. Further, the use of "may" when describing embodiments of the present invention refers to "one or more embodiments of the present invention." In the following description of embodiments of the present invention, the terms of a singular form may include plural forms unless the context clearly indicates otherwise.

It will be understood that although the terms "first" and "second" are used to describe various elements, these elements should not be limited by these terms. These terms are only used to distinguish one element from another element. For example, a first element may be named a second element and, similarly, a second element may be named a first element, without departing from the scope of the present invention. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value.

Figure 1:
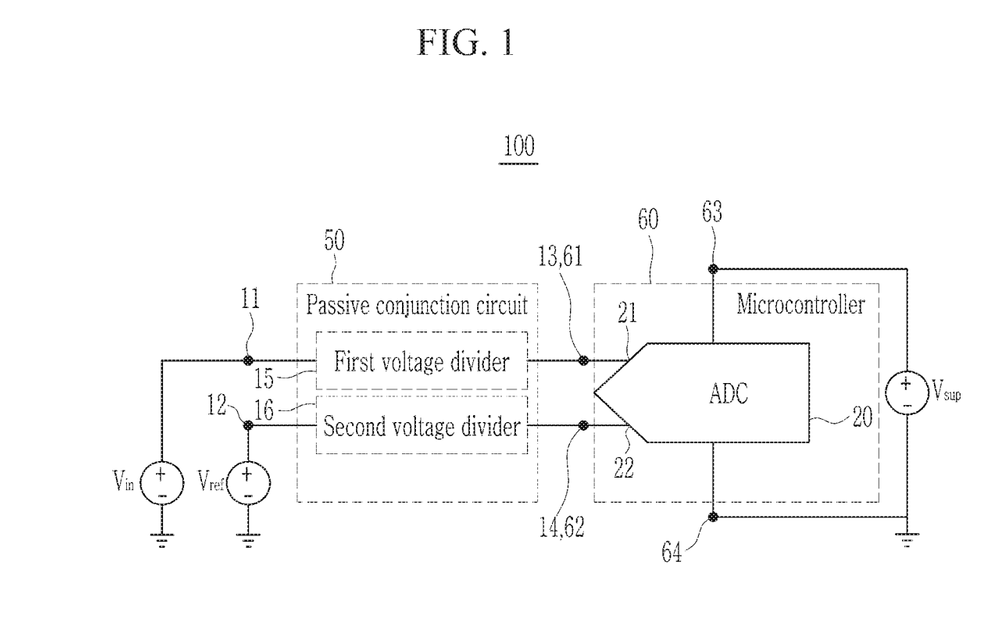
FIG. 1 schematically illustrates a voltage measurement circuit according to an embodiment.

FIG. 1 schematically illustrates a voltage measurement circuit 100 according to an embodiment of the present invention. The voltage measurement circuit 100 comprises a passive conjunction circuit 50 and an ADC 20 as part of a microcontroller 60. Instead of the microcontroller also an ASIC could be used.

The passive conjunction circuit 50 comprises a first input node 11 connected to an analog input voltage $V_{IN}$ and a second input node 12 connected to a reference voltage $V_{REF}$. The first input node 11 is connected to a first output node 13 of the passive conjunction circuit 50 via a first voltage divider 15. The second input node 12 is connected 16 to a second output node 14 of the passive conjunction circuit 50 via a second voltage divider. Therein, voltage $V_{IN}$ might be provided by a sensor, e.g. voltage sensor or temperature sensor, and $V_{REF}$ is utilized by the conjunction circuit 50 to feed the single input signal to the fully differential ADC 20 as a pseudo differential input signal.

The ADC 20 comprises a first differential input 21 that is connected to a first differential input pin 61 of the microcontroller 60 and a second differential input 22 that is connected to a second differential input pin 62 of the microcontroller 60. The microcontroller 60 further comprises a supply voltage pin 63 and a reference ground voltage pin 64 that are each connected to a supply voltage source providing $V_{SUP}$. The supply voltage pin 63 receives $V_{SUP}$ and provides it as an operating and supply voltage to the ADC 20. Reference ground voltage pin 64 receives a reference ground voltage that is derived from the supply voltage source, e.g. by a (not illustrated) resistor network that may comprise active components.

As illustrated in FIG. 1, no connection exists between the reference voltage $V_{REF}$ of the conjunction circuit 50 and the reference ground voltage pin 64 of the microcontroller 60. The passive conjunction circuit 50 hence provides a differential input signal derived from the analog input voltage $V_{IN}$ and the reference voltage $V_{REF}$ that is independent of the ADC's reference ground voltage.

Figure 2:
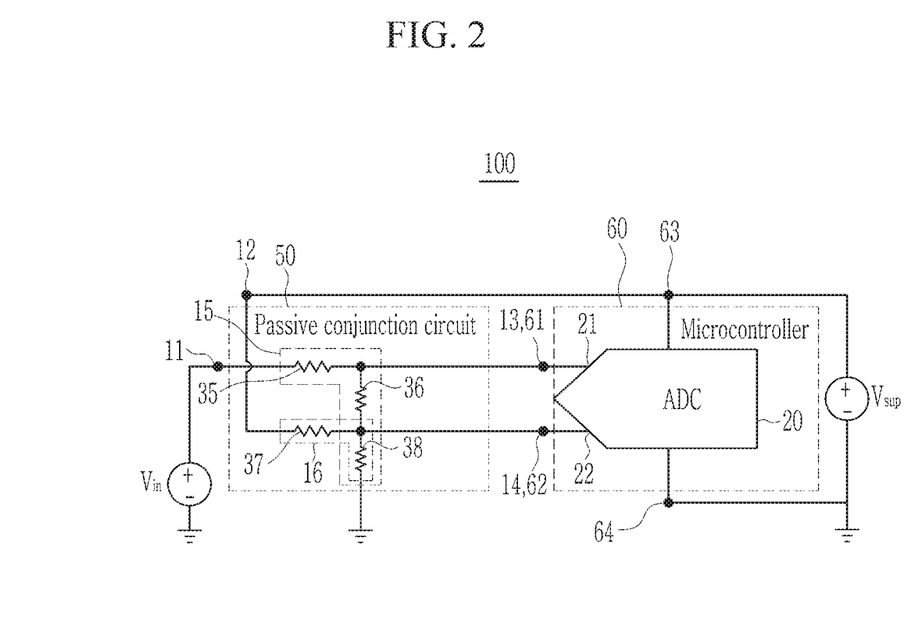
FIG. 2 schematically illustrates a voltage measurement circuit according to an embodiment.

FIG. 2 schematically illustrates a voltage measurement circuit 100 according to an embodiment of the present invention. In the following, a detailed description of components that have been already described with respect to FIG. 1 is omitted.

As illustrated in FIG. 2, the first voltage divider 15 comprises a first resistance consisting of first resistor 35 and comprises a second resistance consisting of second resistor 36 and fourth resistor 38. The second voltage divider 16 comprises a third resistance consisting of third resistor 37 and a fourth resistance consisting of fourth resistor 38. Hence, the fourth resistor 38 is part of the first voltage divider 15 and second voltage divider 16.

The first voltage divider 15 receives the analog input voltage $V_{IN}$ via the first input node 11 and outputs a scaled analog input voltage via first output node 13 that is connected to the first voltage divider 15 between the first resistance and the second resistance, i.e. between the first resistor 35 and the second resistor 36. The second voltage divider 16 receives the reference voltage $V_{REF}$ via the second input node 12 that is connected to the supply voltage pin 63 of the microcontroller 60. The second voltage divider 16 outputs a scaled reference voltage via first output node 13 that is connected to the second voltage divider 16 between the third resistance and the fourth resistance, i.e. between the third resistor 37 and the fourth resistor 38 (or the second resistor 36 and the fourth resistor 38). The resistor network of the passive conjunction circuit 50 hence provides a differential input to the fully differential input nodes 61, 62 of the microcontroller 60 and hence to the differential inputs 21, 22 of the ADC.

Figure 3:
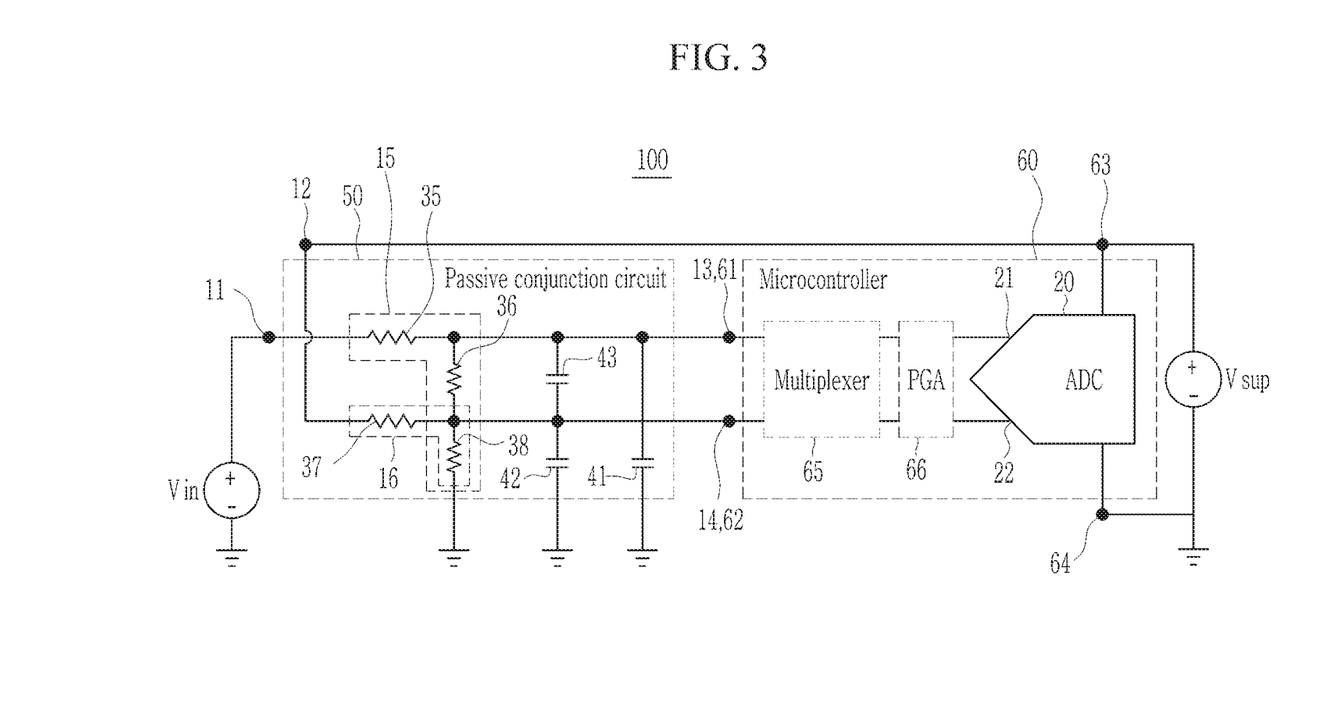
FIG. 3 schematically illustrates a voltage measurement circuit according to an embodiment.

FIG. 3 schematically illustrates a voltage measurement circuit 100 according to an embodiment of the present invention. In the following, a detailed description of components that have been already described with respect to FIG. 1 or FIG. 2 is omitted.

As shown in FIG. 3, the passive conjunction circuit 50 further comprises a first capacitor 41 that is interconnected between the first differential input node 61 (first output node 13) and ground, e.g. grounding of the ADC, further comprises a second capacitor 42 that is interconnected between the second differential input node 62 (second output node 14) and ground, and further a third capacitor 43 interconnected between the first differential input 61 and the second differential input. The first capacitor 41 and the second capacitor 42 comprise, at least essentially, identic nominal capacities and attenuate noise applied to the differential inputs 21, 22 of the ADC 20. Hence, Nyquist theorem can be fulfilled depending on signal bandwidth of $V_{IN}$ and sampling rate of ADC 20.

As further shown in FIG. 3, the microcontroller 60 further comprises a multiplexer 65 and a programmable gain amplifier, PGA, 66 that are interconnected in series between the differential input nodes 61, 62 of the microcontroller 60 and the differential inputs 21, 22 of the ADC 20. Although FIG. 3 illustrates the supply voltage $V_{SUP}$ and a reference ground voltage to be supplied solely to the ADC 20 via supply voltage pin 63 and reference ground voltage pin 64, respectively, these voltages may be also supplied to multiplexer 65 and PGA 66.

The electronic or electric devices and/or any other relevant devices or components according to embodiments of the present invention described herein, except those described explicitly as hardware, may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. The electrical connections or interconnections described herein may be realized by wires or conducting elements, e.g. on a PCB or another kind of circuit carrier. The conducting elements may comprise metallization, e.g. surface metallizations and/or pins, and/or may comprise conductive polymers or ceramics. Further electrical energy might be transmitted via wireless connections, e.g. using electromagnetic radiation and/or light.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like.

Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

What is claimed is:

1. A passive conjunction circuit for an analog-to-digital-converter (ADC), the passive conjunction circuit comprising:
   a first input node configured to receive an analog input signal to be converted by the ADC;
   a second input node configured to receive a reference voltage other than a reference ground voltage of the ADC and being not connected to a reference ground voltage pin of the ADC configured to receive the reference ground voltage of the ADC;
   a first output node configured to be connected to a first differential input of the ADC;
   a second output node configured to be connected to a second differential input of the ADC;
   a first voltage divider interconnected between the first input node and the first output node; and
   a second voltage divider interconnected between the second input node and the second output node,
   wherein the first voltage divider is configured to receive a voltage applied to the first input node as an input voltage and provide an output voltage to the first differential input of the ADC, and
   wherein the second voltage divider is configured to receive a voltage applied to the second input node as an input voltage and provide an output voltage to the second differential input of the ADC.

2. The passive conjunction circuit according to claim 1, wherein the first voltage divider comprises a first resistance connected in series with a second resistance,
   wherein the second voltage divider comprises a third resistance connected in series with a fourth resistance, and
   wherein the fourth resistance is part of the second resistance.

3. The passive conjunction circuit according to claim 2, wherein the first resistance comprises a first resistor, wherein the second resistance comprises a second resistor and a fourth resistor, wherein the third resistance comprises a third resistor and wherein the fourth resistance comprises the fourth resistor.

4. The passive conjunction circuit according to claim 1, wherein the first voltage divider and/or the second voltage divider is further connected to a grounding of the ADC.

5. The passive conjunction circuit according to claim 1, wherein the second input node is configured to receive a supply voltage of the ADC or an external supply voltage.

6. The passive conjunction circuit according to claim 1, wherein the second output node is configured to provide a reference potential to the second differential input.

7. A passive conjunction circuit for an analog-to-digital-converter ADC) the passive conjunction circuit comprising:
   a first input node configured to receive an analog input signal to be converted by the ADC,
   a second input node configured to receive a reference voltage other than a reference ground voltage of the ADC;
   a first output node configured to be connected to a first differential input of the ADC;
   a second output node configured to be connected to a second differential input of the ADC;
   a first voltage divider interconnected between the first input node and the first output node;
   a second voltage divider interconnected between the second input node and the second output node:
   a first capacitor interconnected between the first differential input and a grounding of the ADC; and
   a second capacitor interconnected between the second differential input and a grounding of the ADC.

8. The passive conjunction circuit according to claim 7, further comprising a third capacitor interconnected between the first differential input and the second differential input.

9. The passive conjunction circuit according to claim 8, wherein the capacity of the third capacitor is at least ten times the capacity of at least one of the first capacitor and the second capacitor and/or the first capacitor and the second capacitor comprise identic nominal capacities.

10. A voltage measurement circuit, comprising:
    an analog-to-digital-converter (ADC) including a first differential input and a second differential input configured to receive a differential analog signal, and a supply input configured to receive a supply voltage; and
    a passive conjunction circuit electrically connected to the ADC,
    wherein the passive conjunction circuit comprises:
    a first input node configured to receive an analog input signal to be converted by the ADC;
    a second input node configured to receive a reference voltage other than a reference ground voltage of the ADC;
    a first output node electrically connected to the first differential input of the ADC;
    a second output node electrically connected to the second differential input of the ADC;
    a first voltage divider interconnected between the first input node and the first output node; and
    a second voltage divider interconnected between the second input node and the second output node,
    wherein the passive conjunction circuit is interconnected between the analog input signal and the first and second differential inputs of the ADC, and
    wherein the passive conjunction circuit is configured to receive the supply voltage as the reference voltage.

11. The voltage measurement circuit according to claim 10, wherein the ADC further comprises a reference ground input configured to receive the reference ground voltage, and wherein the reference ground input is isolated from the passive conjunction circuit.

12. The voltage measurement circuit according to claim 10, wherein the ADC is part of a microcontroller, the microcontroller further comprising a first differential input pin, a second differential input pin, and a multiplexer and/or a programmable gain amplifier interconnected between the differential inputs of the ADC and the differential input pins of the microcontroller.

13. The voltage measurement circuit according to claim 10, wherein the ADC is a sigma-delta-analog-to-digital converter.

14. A battery system, comprising a voltage measurement circuit,
    wherein the voltage measurement circuit comprises:
    an analog-to-digital-converter (ADC) including a first differential input and a second differential input configured to receive a differential analog signal, and a supply input configured to receive a supply voltage; and a passive conjunction circuit electrically connected to the ADC, wherein the passive conjunction circuit comprises:

a first input node configured to receive an analog input signal to be converted by the ADC;

a second input node configured to receive a reference voltage other than a reference ground voltage of the ADC;

a first output node electrically connected to the first differential input of the ADC;

a second output node electrically connected to the second differential input of the ADC;

a first voltage divider interconnected between the first input node and the first output node; and a second voltage divider interconnected between the second input node and the second output node, wherein the passive conjunction circuit is interconnected between the analog input signal and the first and second differential inputs of the ADC, and wherein the passive conjunction circuit is configured to receive the supply voltage as the reference voltage.

15. The battery system according to claim 14, further comprising a plurality of battery modules, each battery module comprising a plurality of aligned battery cells connected in series and/or in parallel between a first module terminal and a second module terminal, and a system control unit comprising the voltage measurement circuit.

* * * * *